United States Patent [19]

Farber et al.

[11] 4,035,226

[45] July 12, 1977

[54] METHOD OF PREPARING PORTIONS OF A SEMICONDUCTOR WAFER SURFACE FOR FURTHER PROCESSING

[75] Inventors: Arnold Stanley Farber; Jack Hilibrand, both of Cherry Hill, N.J.

[73] Assignee: RCA Corporation, New York, N.Y.

[21] Appl. No.: 567,818

[22] Filed: Apr. 14, 1975

[51] Int. Cl.² .................................... B29C 17/08
[52] U.S. Cl. ................... 156/653; 148/1.5; 148/187; 156/659; 264/102; 264/139; 264/293; 264/310; 264/340; 427/85; 427/264
[58] Field of Search .......... 264/104, 139, 293, 132, 264/340, 61, 1, 102, 310; 156/6, 12, 653, 659; 29/580; 148/187, 1.5; 427/85, 264

[56] References Cited
U.S. PATENT DOCUMENTS

| | | | |
|---|---|---|---|
| 3,048,512 | 8/1962 | Nelson | 156/12 X |
| 3,165,430 | 1/1965 | Hugle | 156/12 X |
| 3,240,624 | 3/1966 | Beck | 264/104 |
| 3,538,571 | 11/1970 | Callahan et al. | 264/61 |
| 3,542,551 | 11/1970 | Rice | 156/11 X |
| 3,544,287 | 12/1970 | Sharp | 264/61 |
| 3,649,393 | 3/1972 | Hatzakis | 156/12 X |
| 3,923,566 | 12/1975 | Lawson | 156/6 X |

*Primary Examiner*—Thomas P. Pavelko
*Attorney, Agent, or Firm*—H. Christoffersen; R. P. Williams; R. A. Hays

[57] ABSTRACT

A method for producing a pattern on a semiconductor wafer during the fabrication of semiconductor devices, including integrated circuits is disclosed. A master is pressed into a layer of moldable material which is on the wafer surface to define a pattern of at least one relatively thin region and relatively thick regions therein with a high degree of definition. Thereafter the whole layer is treated, for example, to remove, by etching for example, a relatively thin region to expose a portion of the wafer surface, the relatively thick regions remaining on the wafer surface.

19 Claims, 6 Drawing Figures

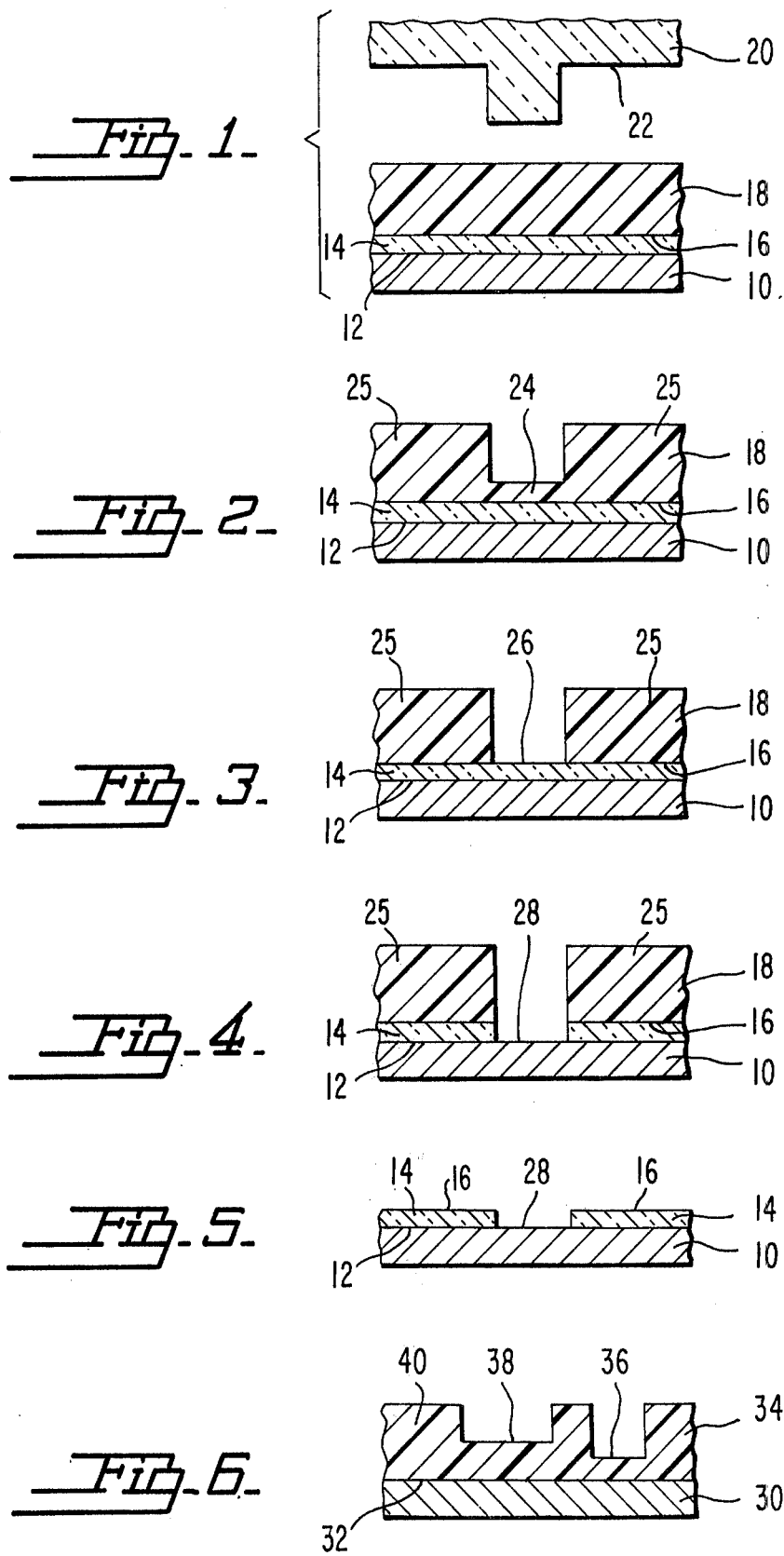

METHOD OF PREPARING PORTIONS OF A SEMICONDUCTOR WAFER SURFACE FOR FURTHER PROCESSING

The present invention relates generally to a method for fabricating semiconductor devices, including integrated circuits, and relates particularly to a technique for preparing portions of a surface for further processing, such as the doped oxide diffusion of conductivity modifiers.

A common technique used for preparing portions of a surface for further processing is photolithography. In that procedure a layer of photosensitive material is deposited on the particular surface to be processed, and the photosensitive material is selectively exposed to light radiation through a mask. The exposure to light radiation changes the characteristics of the photosensitive material irradiated so that upon development either the masked or the unmasked portion may be removed without removing any of the remaining material. The removal of a portion of the photosensitive material thereby exposes the surface below for further processing.

This technique has an inherent resolution limitation that is dependent upon the wavelength of the light radiation used to irradiate the photosensitive material.

Also, due to unavoidable scratching of the mask employed, faithful reproduction of a particular pattern on a large number of surfaces is difficult.

In The Drawings:

FIGS. 1 through 5 are partial cross sectional views illustrating sequential steps of a first embodiment of the present invention, not drawn to scale.

FIG. 6 is a partial cross sectional view illustrating a second embodiment of the present invention, not drawn to scale.

The first embodiment of the present method is sequentially depicted in FIGS. 1 through 5, which show how the present method is employed to prepare a semiconductor wafer 10 for a diffusion process, for example. The semiconductor wafer 10 has a surface 12 which has a layer 14 of insulating material, for example silicon dioxide, disposed thereon.

The layer 14 of insulating material has a surface 16 on which a layer 18 of moldable material for example, a thermoplastic material, is disposed. The layer 18 of thermoplastic material may be deposited for example, by heating a quantity of the material to a fluid state and then flowing it on the surface 16. One method for example, of forming the layer 18 includes placing some of the heated moldable material on the surface 16 and then spinning the wafer to distribute the moldable material relatively evenly over the surface 16. This technique is similar to the technique for forming a photoresist layer which is well known in the art. The layer 18 of moldable material may also be, for example a vinyl, a wax, a polystyrene, or the like. Upon cooling of the layer 18 of thermoplastic material, the wafer 10 is in condition for further processing.

A relief pattern is formed in the layer 18 of thermoplastic material. For this purpose a master 20 is aligned with the wafer 10. The master 20 has a surface 22 which has portions in surface relief; that is, the master surface 22 is high where the surface 16 is to be exposed and low where the surface 16 is to remain covered.

The layer 18 of thermoplastic material is heated until it is pliable. It is preferred, but not necessary, that the master 20 also be heated at the same time. This is preferable so that when the master 20 is pressed into the layer 18 of thermoplastic material, the layer 18 of thermoplastic material is not irregularly cooled. It is also preferred that during the heating step the temperature be maintained below about 300° C. to avoid excess expansion of the master 20.

The master 20 is then pressed into the layer 18 of thermoplastic material. Preferably the space between the master 20 and the layer 18 of thermoplastic material is evacuated prior to prevent air bubbles from being trapped therebetween. The initial thickness of the layer 18 of thermoplastic material on the surface 16 should be such that the master 20 does not contact the surface 16 and should also be such that the ratio of maximum to minimum heights of the imprint remaining after pressing is as large as possible. That is, when the master 20 is pressed into the layer 18, at least a thin region of the layer 18 remains between the master 20 and the semiconductor wafer surface 12. The thickness will preferably be between from about 1,000 A to about 10,000 A.

The master 20 is separated from the layer 18 of thermoplastic material leaving an imprint of the master 20 therein. In the example shown, in FIG. 2, the imprint comprises a relatively thin region 24 of the layer 18 of thermoplastic material surrounded by a relatively thick region 25 thereof. A simple pattern has been shown for clarity. There may be many relatively thin portions, depending on the device being made.

After imprinting, the wafer 10 may be treated in several different ways. In one such way, the layer 18 of thermoplastic material is treated to remove the relatively thin region 24 thereof. For example, the layer 18 may be etched as by plasma etching, wet chemical etching, or the like for a time sufficient to remove the relatively thin region 24 but not sufficient to remove the relatively thick region 25. That is, all of the layer 18 is treated uniformly but only the relatively thin region 24 thereof is substantially completely removed. A portion 26 of the surface 16 is thereby exposed, as shown in FIG. 3.

As illustrated in FIG. 4, using the layer 18 of thermoplastic material as a mask, the layer of insulating material 14 may be selectively removed, for example by etching, to expose a portion 28 of a surface 12 of the semiconductor wafer 10.

The remainder of the layer 18 of thermoplastic material may then be removed, by a further etching treatment, for example, with the results as shown in FIG. 5.

The semiconductor wafer 10 is now ready for any desired treatment, such as a diffusion treatment. This may consist of depositing a doped oxide, not shown, on the surface 12 of the wafer 10 including the portion 28 thereof. Then, by using heat treatments, conductivity modifiers can be driven from the doped oxide into the semiconductor wafer 10 beneath the exposed portion 28. These steps are well known in the semiconductor field.

While the layer 18 of thermoplastic material should be removed prior to a diffusion heat treatment, since the thermoplastic has a comparatively low melting point with respect to the temperatures necessary to drive in any dopants, the layer 18 may be left in place during other treatments. For example, the layer 18 need not be removed during ordinary low temperature treatments of washing or rinsing the wafer 10.

As illustrated in FIG. 6, a plurality of relatively thin regions of different thicknesses may be formed in a layer of thermoplastic material. In this example, a semiconductor wafer 30 has a surface 32 on which a layer 34 of moldable material is disposed. A master, not shown, having raised portions of different heights is pressed into and separated from the layer 34 of thermoplastic material in the same manner as described above. Relatively thin regions 36 and 38 having different thicknesses are thereby formed in the layer 34 if thermoplastic material. One way of using the layer 34 in further processing is to treat it in the manner described above for a time sufficient to remove only one portion of layer 34 of moldable material of, for example, one relatively thin region 36, leaving some of another relatively thin region 38 and the surrounding material 40. One portion of the surface 32 exposed in this manner may then be treated, after which further treating of the layer 34 may be carried out until another portion of layer 34 of moldable material of another relatively thin region 38 is removed. The surrounding material 40 is not yet completely removed. This exposes another portion of the surface 32 for further processing. Thus, a single master can be used to define a plurality of areas on a wafer 30 which may be exposed sequentially. A master having any number of raised portions of different heights may be employed for this purpose.

Another way of using the imprinted layer 34 in further processing is to inject carriers through the relatively thin regions 36 and 38. Ion implantation techniques may be used, for example. In this method the beam of an ion implantation machine is directed toward the layer 34 of thermoplastic material. Since the distance between the imprint 36 and the surface 32 is less than the distance between the relatively thin region 38 of the surface 32 more conductivity modifiers will enter the semiconductor layer 30 beneath the relatively thin region 36 than under either the relatively thin region 38 or the layer 34. Thus the relative doping concentrations within the semiconductor wafer 30 are determined by the distances between the surface 32 and the relatively thin regions 36 and 38. This feature avoids the need to grow layers of insulating material varying thicknesses or to grow and remove a number of such layers to accomplish the desired result.

The present method yields a higher degree of resolution than conventional photolithographic techniques since the master 20 may be fabricated using electron beam, ion beam, or short-wave length optical techniques which are more accurate than the conventional relatively long wave-length photolithographic techniques. The details of such a master 20 are reproduced in the moldable material by the present method.

Also, since the master 20 does not contact the surface 16 the layer 14 of insulating material in FIGS. 1 through 5, or the surface 32 of semiconductor wafer 30 in FIG. 6, it will not be scratched or damaged like conventional masks.

What is claimed is:

1. A method of preparing a portion of a semiconductor wafer surface comprising:
   providing a layer of moldable material on said surface;
   pressing a master into said layer of moldable material, said master having said portion defined in surface relief, at least a thin region of said layer remaining between said master and said semiconductor wafer surface;
   separating said master from said layer of moldable material, thereby leaving an imprint of said master in said layer of moldable material, said imprint comprising a relatively thin region and a relatively thick region in said layer; and
   uniformly etching said layer for a time sufficient to remove said relatively thin region but insufficient to remove said relatively thick region.

2. A method as claimed in claim 1 wherein said providing step comprises:
   heating said moldable material to a fluid state;
   disposing said moldable material on said surface in its fluid state; and
   cooling said moldable material.

3. A method as claimed in claim 2 wherein said disposing step comprises:
   placing said moldable material on said semiconductor wafer surface; and
   spinning said wafer to distribute said moldable material relatively evenly over said surface.

4. A method as claimed in claim 1 further comprising:
   heating said moldable material until it is pliable prior to said pressing step.

5. A method as claimed in claim 1 further comprising:
   heating said master prior to said pressing step.

6. A method as claimed in claim 1 further comprising:
   evacuating the space between said master and said layer of moldable material prior to said pressing step.

7. A method as claimed in claim 1 further comprising:
   forming a layer of insulating material on said semiconductor wafer surface; and
   forming said layer of moldable material on said layer of insulating material.

8. A method as claimed in claim 7 further comprising:
   treating said layer for a time sufficient to remove said relatively thin region of said layer of moldable material, thereby exposing some of said layer of insulating material.

9. A method as claimed in claim 1 wherein:
   said imprint comprises a plurality of relatively thin regions of different thicknesses.

10. A method as claimed in claim 9 further comprising:
    treating said layer of moldable material for a time sufficient to remove one portion of said layer of one relatively thin region; thereby exposing one portion of said surface;
    processing said one portion of said surface;
    treating said layer of moldable material for a time sufficient to remove another portion of said layer of moldable material of another relatively thin region, thereby exposing another portion of said surface; and
    processing said another portion of said surface.

11. A method as claimed in claim 1 wherein:
    said layer of moldable material is a thermoplastic.

12. A method of preparing a portion of a semiconductor wafer surface comprising:
    providing a layer of moldable material on said surface;
    pressing a master into said layer of moldable material, said master having said portion defined in surface relief, at least a thin region of said layer remaining between said master and said semiconductor wafer surface;

separating said master from said layer of moldable material, thereby leaving an imprint of said master in said layer of moldable material, said imprint comprising a relatively thin region and a relatively thick region in said layer; and uniformly subjecting said layer to a source of conductivity modifiers, whereby more of said conductivity modifiers penetrate said semiconductor wafer surface beneath said relatively thin region than beneath said relatively thick region.

13. A method as claimed in claim 12 wherein said uniformly subjecting step comprises:

ion implanting conductivity modifiers into said layer.

14. A method as claimed in claim 13 wherein said providing step comprises:

heating said moldable material to a fluid state;

disposing said moldable material on said surface in its fluid state; and cooling said moldable material.

15. A method as claimed in claim 14 wherein said disposing step comprises:

placing said moldable material on said semiconductor wafer surface; and spinning said wafer to distribute said moldable material relatively evenly over said surface.

16. A method as claimed in claim 12 further comprising:

heating said moldable material until it is pliable prior to said pressing step.

17. A method as claimed in claim 12 further comprising:

heating said master prior to said pressing step.

18. A method as claimed in claim 12 further comprising:

evacuating the space between said master and said layer of moldable material prior to said pressing step.

19. A method as claimed in claim 12 wherein:

said imprint comprises a plurality of relatively thin regions of different thicknesses.

* * * * *